ище

United States Patent
Teulings et al.

(10) Patent No.: US 7,256,574 B2
(45) Date of Patent: Aug. 14, 2007

(54) DEVICE FOR MEASURING ELECTRIC CURRENT INTENSITY

(75) Inventors: Wim Teulings, Fontenilles (FR); Jean-Louis Lando, Saverdun (FR); Didier Puech, Toulouse (FR)

(73) Assignee: Siemens VDO Automotive, Toulouse Cedex (FR)

(*) Notice: Subject to any disclaimer, the term of this patent is extended or adjusted under 35 U.S.C. 154(b) by 0 days.

(21) Appl. No.: 10/533,793

(22) PCT Filed: Oct. 6, 2003

(86) PCT No.: PCT/EP03/11020

§ 371 (c)(1),
(2), (4) Date: Nov. 21, 2005

(87) PCT Pub. No.: WO2004/042410

PCT Pub. Date: May 21, 2004

(65) Prior Publication Data

US 2006/0119342 A1    Jun. 8, 2006

(30) Foreign Application Priority Data

Nov. 4, 2002   (FR) .................................. 02 13770

(51) Int. Cl.
   *G01R 15/18* (2006.01)
(52) U.S. Cl. ..................... 324/117 R; 324/357
(58) Field of Classification Search ..................... None
   See application file for complete search history.

(56) References Cited

U.S. PATENT DOCUMENTS 4,639,665 A * 1/1987 Gary ...................... 324/117 H
5,477,135 A * 12/1995 Baker ........................ 324/130
5,734,264 A * 3/1998 Berna et al. ............. 324/117 H
6,043,641 A * 3/2000 Singer et al. ................ 324/127
6,177,791 B1 * 1/2001 Lenhard ..................... 323/357
6,534,967 B1 * 3/2003 Weggel ....................... 324/127
6,713,999 B1 * 3/2004 Lenhard et al. .......... 324/117 R
6,727,684 B2 * 4/2004 Hatanaka ................. 324/117 H
6,914,422 B2 * 7/2005 Baxter et al. ............ 324/117 R

FOREIGN PATENT DOCUMENTS

| DE | 26 32 377    | 1/1978  |
| DE | 41 42 342    | 6/1993  |
| DE | 196 42 472   | 4/1998  |
| DE | 197 05 767   | 8/1998  |
| DE | 197 05 767 C2 | 8/1998 |
| DE | 197 05 768   | 8/1998  |
| DE | 199 19 602   | 11/2000 |

* cited by examiner

*Primary Examiner*—Ha Tran Nguyen
*Assistant Examiner*—Richard Isla-Rodas
(74) *Attorney, Agent, or Firm*—Young & Thompson

(57) ABSTRACT

A magnetic field generated by a primary winding (1) in which the current ($i_1$) to be measured flows is balanced by a magnetic field of opposing direction generated by a secondary winding (2) in which a compensating current ($i_2$) flows. The device includes a member (3) sensitive to the field resulting from the addition of the magnetic fields of opposing directions to regulate the compensating current ($i_2$) in closed loop mode. According to the invention, the sensitive member (3) is sensitive only to the direction of the resultant field and, in return, controls the reversal of the direction of circulation of the compensating current ($i_2$) in the secondary winding (2). This sensitive member (3) can be formed by a Hall effect probe with bipolar output signal. The device is suitable for the measurement of a current in automotive electronics.

11 Claims, 1 Drawing Sheet

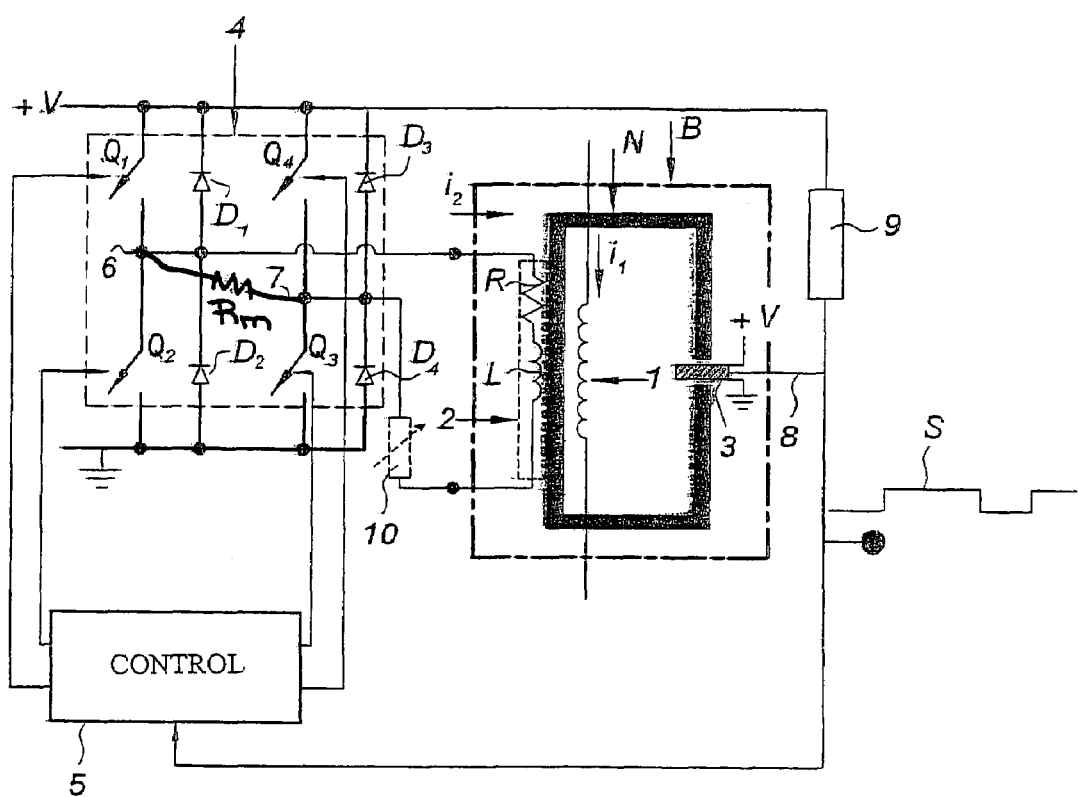

DEVICE FOR MEASURING ELECTRIC CURRENT INTENSITY

CROSS REFERENCE TO RELATED APPLICATIONS

This is the 35 USC 371 national stage of international application PCT/EP2003/011020, filed on 6 Oct. 2003, which designated the United States of America.

The present invention relates to a device for measuring the intensity of an electric current and, more particularly, to such a device of the compensation type according to which a magnetic field generated by a primary winding in which the current to be measured flows is balanced by a magnetic field of opposite direction generated by a secondary winding in which a compensating current flows, this device comprising a means sensitive to the field resulting from the addition of said magnetic fields of opposing directions to regulate said compensating current in closed loop mode.

BACKGROUND OF THE INVENTION

Such devices are known, in particular from DE 196 42 472, DE 197 05 767, DE 197 05 768 and DE 199 19 602. In the devices of this type, balancing the magnetic fields generated by the two windings, primary and secondary formed on a common core of ferromagnetic material, involves interlocking the current powering the secondary winding with a zero value of the resultant magnetic field detected by the means sensitive to this field. When the resultant field is zero, the current to be measured and the current in the secondary winding are in inverse ratio to the number of turns of these windings. A measurement of the intensity of the current flowing in the secondary winding, carried out when the fields are in balance, can therefore be used to achieve the intensity of the current to be measured. Thus, perfect electrical insulation is ensured between the circuit in which the current to be measured is flowing and the circuit in which the balancing current is flowing.

In the devices of this type, the means sensitive to the resultant field is most commonly formed by a linear Hall effect probe, positioned in an airgap of the ferromagnetic core, for example. Such a probe delivers an electrical signal representative of both the direction and the intensity of the flux of the resultant field in the airgap. To detect cancellation of this flux, detection upon which the operation of the device depends, the signal is processed in a comparator and, with the help of a clock, a pulse width modulated signal can be formed, specifically to control the power supply of the secondary winding.

Drifts on such a device, due to thermal and mechanical stresses such as those routinely affecting electronic devices on board motor vehicles for example, must therefore be compensated by additional electronic means which add to the production cost of the device. A solution to this problem could be to use a linear, programmable Hall effect probe, which commonly incorporates means of providing the necessary compensations for thermal and/or mechanical drifts. This solution is, however, also hampered by the high cost of these programmable probes. It is therefore unsuitable for mass productions intended for a wide customer base, which need to be produced at the lowest possible costs, as in the case in particular of the electronic circuitry on board motor vehicles.

SUMMARY OF THE INVENTION

The object of the present invention is therefore to produce a device for measuring the intensity of an electric current, of compensation type, which can be produced at low cost, but without compromising the accuracy of the measurements supplied.

The object of the present invention is also to produce such a device, more particularly suited to measuring electric currents in a motor vehicle environment.

These objects of the invention are achieved, together with others which will become apparent on reading the description that follows, with a device of the type described in the introduction to this description, noteworthy in that the means sensitive to the field resulting from the addition of the magnetic fields of opposing directions generated by the primary and secondary windings, is sensitive only to the direction of said resultant field and, in return, controls the reversal of the direction of circulation of the compensating current in said secondary winding.

As will be seen later in detail, by forming this sensitive means with a Hall effect probe with bipolar output signal, commercially available, a measurement device can be produced that satisfies the two cumulative constraints set out above, in terms of production cost and accuracy of the measurements obtained.

According to other, optional, characteristics of the device according to the invention:

- the windings are formed on a common core of ferromagnetic material presenting a low hysteresis to provide a limit cycle oscillation at a sufficiently high frequency of said compensating current about a value corresponding to the exact compensation of the field generated by said primary winding,
- the device comprises means of measuring a voltage at the terminals of a resistor placed in series with the secondary winding, to obtain from this the value of the current to be measured, through that of the compensating current,
- as a variant, the device comprises means of measuring the duty cycle of the pulse width modulated output signal, delivered by said means sensitive to the direction of said resultant field, to obtain from this the value of the current to be measured, through that of the compensating current,
- the device according to this variant comprises temperature correction means for the circuit of the secondary winding,
- the device comprises an H-configuration transistor bridge positioned in the power supply circuit of the secondary winding and means for controlling the reversal by this bridge of the direction of the current circulating in the winding, in response to the transitions of the signal delivered by the probe.

BRIEF DESCRIPTION OF THE DRAWINGS

Other features and advantages of the present invention will become apparent on reading the description that follows and examining the appended drawing in which the single figure diagrammatically represents a preferred embodiment of the device according to the invention.

DETAILED DESCRIPTION OF THE INVENTION

In this FIGURE, the block B represents a current transformer conventionally comprising a core N of a ferromagnetic material (round or rectangular) on which are wound primary 1 and secondary 2 windings, in which the current $i_1$ to be measured and a compensating current $i_2$ are respectively intended to flow, as was seen above in the description of the type of measurement device to which the device according to the invention belongs. Such a current transformer provides the electrical insulation mentioned above and operates for DC currents up to a few kHz.

The ferromagnetic core N advantageously takes the form of a ring cut by a narrow airgap. The two windings are powered in such a way that the magnetic field fluxes that they generate are, in this airgap, colinear and in opposing directions.

For a reason that will become apparent below, the secondary winding 2 is represented, in the FIGURE, broken down into its electrical resistance R and its inductance L.

A sensor 3 is placed in the airgap of the ferromagnetic core N so as to be sensitive to the direction of the magnetic field prevailing in this airgap, resulting from the addition of the opposing fields generated by the two windings wound on the ferromagnetic core.

The electrical power supply for the secondary winding 2 is provided by a +V direct current voltage source (commonly 5 V, in automotive electronics), through a conventional "H" configuration bridge of four transistors $Q_1$ to $Q_4$, diagrammatically represented in the FIGURE in the form of controlled switches. These transistors can be of MOSFET type. They are then conventionally each associated with a "freewheeling" diode $D_1$ to $D_4$, respectively.

The closed loop mode regulation of the current flowing in the secondary winding 2 is handled by control means 5 of the bridge 4, themselves controlled by the output signal S of the sensor 3.

According to the present invention, this sensor 3 is sensitive only to the reversal of the direction of the magnetic field prevailing in the airgap in which it is located.

Advantageously, this sensor can be formed by a bipolar output Hall effect probe. Such a probe can be found in the catalogs of a number of electronic component manufacturers and, notably, in those of MICRONAS (Germany), in particular the "Hall switch" probe, reference HAL 501 from the HAL 5xx family of probes.

This bipolar output probe takes the form of an integrated circuit comprising in particular a linear Hall effect probe delivering a signal powering an input of a comparator, the output of the comparator controlling the conduction of a transistor. When the latter is off (collector open), the voltage on the output pin 8 of the sensor is "pulled up" to +V by the resistor 9 connected between this pin and the +V source. When the transistor is on, this pin is grounded.

It follows that the output signal S of the probe 3 is a "bipolar" square-wave signal alternating between the +V and 0 voltage levels.

The HAL 501 probe mentioned above is provided, in particular, with temperature and mechanical stress compensation means which make external means for these purposes unnecessary. It is also available at low cost and is therefore suitable for satisfying the reduced cost objective set down for the present invention.

There now follows a description of the operation of a current measuring device according to the invention, the structure of which is described above.

When the signal S is positive (+V level) the magnetic field prevailing in the airgap of the ferromagnetic core is oriented in a direction that is arbitrarily qualified as "positive". The control means 5 then keep the transistors $Q_1$ and $Q_3$ turned on. A current $i_2$ flows in a circuit connected between the terminals 6 (then at the +V voltage) and 7 (then grounded), these terminals being common, respectively, with the transistors $Q_1$, $Q_2$ and $Q_3$, $Q_4$ respectively. This circuit comprises the secondary winding 2 and, where appropriate, a CTN resistor 10 (represented as a broken line) mounted in series for a reason that will be explained later. The current $i_2$ increases until the flux generated by the secondary winding 2 exceeds that generated by the primary winding 1, in which the current $i_1$ to be measured is flowing. When the direction of the resultant field in the airgap is reversed, the signal S switches to its low level (ground potential) resulting in the transistors $Q_1$ and $Q_3$ being turned off and the transistors $Q_2$ and $Q_4$ being turned on, the latter then applying a negative potential difference between the terminals 6 and 7. The result is a decrease in the current $i_2$ and a new increase in the field prevailing in the airgap.

It will be understood that the signal S is of pulse width modulation (PWM) type, and that it makes the current $i_2$ oscillate about a mean value corresponding to a zero flux of the magnetic field in this airgap. This oscillation is then self-maintaining. It is qualified as "limit cycle" and results from the weak hysteresis of the material used to form the ferromagnetic core (permalloy, for example).

Provided that the oscillation frequency is very much greater than the switching frequency of the filter formed by the inductance L and the total resistance $R_t$ of the circuit between the terminals 6 and 7, the average value of the current $i_2$ is directly proportional to the current $i_1$ to be measured.

$i_2$ can be obtained from a simple measurement of the voltage at the terminals of a measurement resistor $R_m$ placed in series with the inductor 2, between the terminals 6 and 7. In this case, the resistance R represented in the FIGURE of the drawing corresponds to the sum of this resistance $R_m$ and the resistance of the inductor 2. If Rm is a resistor with low thermal drift, the sensor has no need for any temperature compensation, because the thermal drifts are compensated by the interlock function by varying the duty cycle.

In a second measurement path of the current $i_2$, the latter is obtained from a measurement of the duty cycle δ of the PWM signal delivered by the sensor 3. It can, in effect, be demonstrated that, for a switching period T of this signal that is very short relative to the time constant $L/R_t$ of the secondary winding circuit, the following applies:

$$i_2 = \frac{V}{R_t}(2\delta - 1)$$

δ being the duty cycle of the PWM signal delivered by the sensor 3 and $R_t$ the total resistance of the circuit between the terminals 6 and 7.

Measuring this duty cycle costs nothing in an environment comprising a digital computer, as is the case with automotive electronics. All that is required is to deliver the signal S to such a computer, appropriately programmed to obtain a measurement of δ and, from that, of $i_2$ and of the current $i_1$ to be measured.

However, it is then necessary to include in the secondary winding circuit temperature compensation means formed, for example, by a negative temperature coefficient resistor such as the resistor 10 represented in the single FIGURE, to correct a temperature drift of the resistor R and more particularly that of the winding also.

It will be noted that the abovementioned HAL 501 sensor from Micronas presents hysteresis, in the sense that the values of the fields provoking the switching of its output signal from one direction to another are not normally identical. This sensor includes internal means of adjusting this hysteresis. When it is used in the case of the present invention, it is advantageous to eliminate this hysteresis completely, which a person skilled in the art can normally achieve using these adjustment means.

The accuracy of the current measurements obtained via an analog voltage measurement is ±0.25% of full measurement scale at 25° C., and ±0.4% between −40° C. and +125° C., the temperature range routinely taken into account in automotive electronics.

The accuracy of the measurements obtained via the duty cycle δ of the PWM signal is approximately ±1% between −40° C. and 125° C.

It now appears that the present invention can indeed be used to achieve the objective, that is, to provide a device for measuring an electric current, of the compensation type, which is both accurate and inexpensive to produce.

The bipolar output Hall effect sensor used in the invention also presents the advantage of requiring no external temperature compensation means, such means being incorporated in the sensor. It delivers a PWM signal that can be directly used by an H-configuration transistor bridge. There is therefore no need to use a clock signal generator and a PWM modulation circuit to obtain such a signal.

The PWM output of the sensor is at low impedance and is highly robust. The PWM signal delivered to the open collector output of the output transistor of the sensor is extremely robust with respect to the noises induced by the environment, which is invaluable in automotive electronics. Since the output current is high, it does not need to be amplified before being delivered to the control means 5 of the H-configuration transistor bridge.

Naturally, the invention is not limited to the embodiment described and represented which is given purely by way of example. Thus, the invention is not limited to the use of a bipolar output Hall effect sensor. This sensor could be replaced by a magneto-resistive probe designed to deliver a PWM signal similar to that described above.

The invention claimed is:

1. A device for measuring an electric current, comprising:
    a sensor (3) positioned in an airgap of a core (N) of a transformer (B) and sensitive to a direction of a magnetic field prevailing in the airgap,
    the transformer, in use, having a first electric current ($i_1$) of a first magnetic field of a first direction generated by a primary winding (1) of the transformer,
    the transformer, in use, having the first electric current balanced by a second magnetic field of second direction opposite the first direction and generated by a secondary winding (2) of the transformer in which a second compensating current ($i_2$) flows,
    the magnetic field in the airgap being a field resulting from an addition of the first and second magnetic fields,
    the sensor (3) configured to regulate said compensating current ($i_2$) in closed loop mode by the sensor (3) sensing only a direction of said resultant magnetic field and controlling a reversal of a direction of circulation of the compensating current ($i_2$) in said secondary winding (2), the sensor being sensitive only to the direction of said resultant magnetic field,
    a measurement resistor ($R_m$) placed in series with the secondary winding (2) to obtain a value of the first current ($i_1$) through a measurement of the second compensating current ($i_2$), and
    a temperature correction element (10) for the circuit of said secondary winding (2),
    the temperature correction element being connected in series with the measurement resistor.

2. The device of claim 1, further comprising:
    an electrical power supply connected to the secondary winding, the power supply comprising i) transistors configured as an H-configuration transistor bridge ($Q_1$, $Q_2$, $Q_3$, $Q_4$) and ii) freewheeling diodes ($D_1$, $D_2$, $D_3$, $D_4$), the power supply being supplied by a supply voltage (V+).

3. The device of claim 2, further comprising:
    a controller (5) connected to the transistor bridge and to an output signal (S) of the sensor, the controller arranged to provide closed loop mode regulation of current flowing in the secondary winding, the controller being controlled by the output signal (S) of the sensor.

4. The device of claim 3, wherein,
    the sensor is a bipolar output Hall effect probe.

5. The device of claim 4, wherein,
    the output signal of the sensor (8) is a square wave with a positive value equal to the supply voltage (+V) and a low value equal to a zero (0) voltage level.

6. The device of claim 3, wherein,
    the output signal of the sensor (8) is a square wave with a positive value equal (V+) and a low value equal to a zero voltage level,
    the magnetic field alternates between
    i) the magnetic field in the airgap prevailing in a first direction causing the output signal to have the positive value and the output signal acting on the controller to keep a first set of transistors ($Q_1$, $Q_3$) of the transistor bridge turned on and a second set of transistors of the transistor bridge turned off, and
    ii) the magnetic field in the airgap prevailing in a second direction causing the output signal to have the low value and the output signal acting on the controller to keep the second set of transistors ($Q_2$, $Q_4$) turned on and the first set of transistors turned off.

7. The device of claim 6, wherein,
    while the first electric current ($i_1$) and the first magnetic field exceed the second current ($i_2$) and the second magnetic field the output signal has the positive value and direction of the magnetic field in the airgap is a first direction,
    upon the second electric current exceeding the first electric current, the direction of the magnetic field in the airgap reverses to a second direction and the output signal switches to the low value.

8. The device of claim 7, wherein,
    the output signal is a pulse width modulation signal oscillating about a mean value corresponding to a zero flux of the magnetic field in this airgap, and
    oscillation of the output signal is self-maintaining.

9. The device of claim 1, wherein,
    core (N) is a ferromagnetic material.

10. The device of claim 1, further comprising:
    an H-configuration transistor bridge (4) positioned in a power supply circuit of said secondary winding (2) and a controller (5) connected to control reversal by said bridge (4) of the direction of the second current ($i_2$) circulating in said secondary winding (2), in response to the transitions of the signal delivered by said sensor (3).

11. The device of claim 1, wherein said device is an automotive electronic.

* * * * *